United States Patent
Elachkar et al.

(12) 
(10) Patent No.: US 6,425,097 B1
(45) Date of Patent: Jul. 23, 2002

(54) METHOD AND APPARATUS FOR TESTING AN IMPEDANCE-CONTROLLED INPUT/OUTPUT (I/O) BUFFER IN A HIGHLY EFFICIENT MANNER

(75) Inventors: Samir M. Elachkar, San Jose; Thomas Le, Milpitas, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/320,821

(22) Filed: May 27, 1999

(51) Int. Cl.[7] .................................................. H02H 3/05
(52) U.S. Cl. .............................. 714/43; 326/30; 326/82
(58) Field of Search ............................... 714/25, 27, 32, 714/40, 43, 47; 326/30, 16, 82; 702/191; 324/765, 158.1, 525, 527; 327/74, 112, 170; 710/305–317

(56) References Cited

U.S. PATENT DOCUMENTS

| | | | |
|---|---|---|---|
| 4,514,845 A | * | 4/1985 | Starr |
| 4,707,620 A | * | 11/1987 | Sullivan et al. |
| 4,951,283 A | * | 8/1990 | Mastrocola |
| 5,095,231 A | * | 3/1992 | Sartori et al. |
| 5,107,230 A | * | 4/1992 | King |
| 5,194,765 A | * | 3/1993 | Dunlop et al. |
| 5,321,320 A | * | 6/1994 | Collins |
| 5,483,188 A | * | 1/1996 | Frodsham |
| 5,677,639 A | * | 10/1997 | Masiewicz |
| 5,732,027 A | | 3/1998 | Arcoleo et al. |
| 5,751,161 A | | 5/1998 | Wei et al. |
| 5,877,638 A | * | 3/1999 | Lin |
| 5,898,321 A | * | 4/1999 | Ilkbahar et al. |

FOREIGN PATENT DOCUMENTS

GB 2 272 120 5/1994
GB 2 291 295 1/1996

OTHER PUBLICATIONS

Search Report for International Application No. PCT/US 00/13458, mailed Oct. 19, 2000.

* cited by examiner

*Primary Examiner*—Robert Beausoleil
*Assistant Examiner*—Yolanda Wilson
(74) *Attorney, Agent, or Firm*—Conley, Rose & Tayon, PC; B. Noël Kivlin

(57) ABSTRACT

A method and apparatus for efficiently testing input/output (I/O) buffer are disclosed. The I/O buffer includes multiple transistors coupled to a data output terminal. The method includes enabling a single one of the multiple transistors. A predetermined electrical voltage level is then forced upon the data output terminal, and a resultant electrical current flowing through the data output terminal (e.g., in a direction away from the I/O buffer) is measured. The measured electrical current is compared to predetermined minimum and maximum current values. A ratio of the measured electrical current to a reference current is computed, and the computed current ratio is compared to a predetermined minimum and maximum current ratio. The above steps may be repeated until each of the multiple transistors has been enabled. The drive strength of a given transistor is a measure of the amount of electrical current the transistor causes to flow through the data output terminal when enabled. One or more of the multiple transistors has a drive strength which is less than all of the other transistors (i.e., a minimum drive strength). The reference current may be the amount of electrical current flowing through the data output terminal with the predetermined voltage level forced thereupon when the single enabled transistor has the minimum drive strength. By testing the impedances of the individual transistors of an I/O buffer independently, the method and apparatus accomplish I/O buffer testing in a highly efficient manner.

20 Claims, 6 Drawing Sheets

METHOD AND APPARATUS FOR TESTING AN IMPEDANCE-CONTROLLED INPUT/OUTPUT (I/O) BUFFER IN A HIGHLY EFFICIENT MANNER

BACKGROUND OF THE INVENTION

1. Field of the Invention

This invention relates to input/output (I/O) buffers used to drive signals upon, and receive signal from, transmission lines, and more particularly to the testing of impedance-controlled I/O buffers.

2. Description of the Relevant Art

Digital electronic devices typically communicate via electrical signals (e.g., voltage and/or current) driven upon electrical conductors (e.g., metal wires). As the operating frequencies (i.e., "speeds") of digital electronic devices increase, electrical conductors used to route signals between components (i.e., signal lines) begin to behave like transmission lines. Transmission lines have characteristic impedances. If the input impedance of a receiving device connected to a transmission line does not match the characteristic impedance of the transmission line, a portion of an incoming signal is reflected back toward a sending device. Such reflections cause the received signal to be distorted. If the distortion is great enough, the receiving device may erroneously interpret the logical value of the incoming signal.

Binary digital signals typically have a low voltage level associated with a logic low (i.e., a logic "0"), a high voltage level associated with a logic high (i.e., a logic "1"), "rise times" associated with transitions from the low voltage level to the high voltage level, and "fall times" associated with transitions from the high voltage level to the low voltage level. A signal line behaves like a transmission line when the signal rise time (or signal fall time) is short with respect to the amount of time required for the signal to travel the length of the signal line (i.e., the propagation delay time of the signal line). As a general rule, a signal line begins to behave like a transmission line when the propagation delay time of the signal line is greater than about one-quarter of the signal rise time (or signal fall time).

Resistive "termination" techniques are often applied to transmission lines, and signal lines long enough to behave like transmission lines, in order to reduce reflections and the resultant signal distortion. One or more electrically resistive elements may be inserted between each sending device and the signal line (i.e., transmission line) in order to cause the effective output impedances of the sending devices to more closely match the characteristic impedance of the transmission line. Similarly, one or more electrically resistive elements may be inserted between each receiving device and the transmission line in order to cause the effective input impedances of the receiving devices to more closely match the characteristic impedance of the transmission line.

Impedance-controlled buffers are often used to drive "unterminated" transmission lines. In order to reduce signal reflections and distortion, the output impedance of an impedance-controlled I/O buffer connected to a transmission line is adjusted such that the output impedance is substantially equal to the characteristic impedance of the transmission line. Several factors may affect this impedance matching, including: (i) device variations due to variations in the fabrication process, (ii) supply voltage variations, and (iii) operating temperature variations. As a result, the output impedances of impedance-controlled I/O buffers are generally made variable and controllable by a one or more logic signals.

FIG. 1 is a block diagram of an exemplary impedance-controlled I/O buffer 10. I/O buffer 10 includes a pre-driver section 12 coupled to a driver section 14. Pre-driver section 12 receives an input data signal "DATA_IN" at a data input terminal labeled "DATA_IN". Pre-driver section 12 also receives binary p-channel transistor enable signals "EP1–EP5" and n-channel transistor enable signals "EN1–EN5" (e.g., from a control unit). Pre-driver section 12 may include logic elements which produce p-channel transistor control signals "P1–P5" from enable signals EP1–EP5 and input data signal DATA_IN, and n-channel transistor control signals "N1–N5" from enable signals EN1–EN5 and input data signal DATA_IN. Driver section 14 receives p-channel transistor control signals P1–P5 and n-channel transistor control signals N1–N5 and produces an output data signal "DATA_OUT" at an data output terminal labeled "DATA_OUT".

FIG. 2 is a circuit diagram of an exemplary embodiment of driver section 14. Driver section 14 includes five driver pairs 16–20. Each driver pair includes a p-channel transistor and an n-channel transistor connected in series between a first power supply voltage $V_{DD}$ and a second power supply voltage $V_{SS}$, where $V_{DD} > V_{SS}$. Within each driver pair, a source region of the p-channel transistor is connected to $V_{DD}$, a drain region of the p-channel transistor is connected to a drain region of the corresponding n-channel transistor at an output node, and a source region of the n-channel transistor is connected to $V_{SS}$. The output nodes of all five driver pairs are connected to the DATA_OUT terminal of I/O buffer 10 as shown in FIG. 2.

Each driver pair of driver section 14 has an output electrical impedance which is largely resistive and inversely related to the current sourcing and sinking capability of the driver (i.e., the "drive strength" of the driver pair). The driver pairs may be configured such that the relative drive strengths double from one driver pair to the next. For example, a first driver pair 16 may have a base or reference drive strength, and a corresponding base or reference output impedance. A second driver pair 17 may have a drive strength twice the drive strength of driver pair 16, and an output impedance half that of driver pair 16. A third driver pair 18 may have a drive strength twice that of second driver pair 17 and 4 times the drive strength of first driver pair 16, and an output impedance one-fourth that of driver pair 16. A fourth driver pair 19 may have a drive strength twice that of third driver pair 18 and 8 times the drive strength of driver pair 16, and an output impedance one-eighth that of driver pair 16. A fifth driver pair 20 may have a drive strength twice that of fourth driver pair 19 and 16 times the drive strength of driver pair 16, and an output impedance one-sixteenth that of driver pair 16.

The transistors of driver section 14 need not be enabled in pairs, hence the separate enable signals EP1–EP5 and EN1–EN5. When the DATA_IN signal is a logic high (i.e., a logic '1'), at least one p-channel transistor of driver section 14 is enabled by a corresponding enable signal EPx, where x is an integer between 1 and 5, and the output impedance "$Z_{OUT}$" of I/O buffer 10 is a parallel combination of the impedances of all of the enabled p-channel transistors. Similarly, when the DATA_IN signal is a logic low (i.e., a logic '0'), at least one n-channel transistor of driver section 14 is enabled by a corresponding enable signal ENx, and the output impedance $Z_{OUT}$ of I/O buffer 10 is a parallel combination of all of the enabled n-channel transistors. Each transistor of driver section 14 has a different impedance inversely related to its current sourcing or sinking capability, thus the output impedance of I/O buffer 10 may be controlled by selectively asserting enable signals EP1–EP5 and EN1–EN5.

The DATA_OUT terminal of I/O buffer 10 may be connected to one end of a transmission line, and enable signals EP1–EP5 and EN1–EN5 may be selectively enabled (e.g., by a control unit) such that the output impedance $Z_{OUT}$ of I/O buffer 10 is substantially equal to the characteristic impedance of the transmission line. As a result, errors resulting from signal reflections and distortion may be reduced. Additionally, the values of enable signals EP1–EP5 and EN1–EN5 may be adjusted during operation to compensate for changes in the output impedance $Z_{OUT}$ of I/O buffer 10 due to variations in power supply voltages and/or variations in temperature.

When the values of enable signals EP1–EP5 and EN1–EN5 are changed during operation, data transmission errors may occur during "transition times" of enable signals EP1–EP5 and EN1–EN5 when enable signals EP1–EP5 and EN1–EN5 are changing state. The changing values of enable signals EP1–EP5 and EN1–EN5 may produce an "intermediate" value of the output impedance $Z_{OUT}$ of I/O buffer 10 which is different from the original value and the desired final value. Intermediate values of $Z_{OUT}$ greater than original values may result in data transmission errors.

For example, if the output impedance $Z_{OUT}$ of I/O buffer 10 is changed immediately following a DATA_OUT transition from logic "1" to logic "0", and an intermediate value of $Z_{OUT}$ is greater than the original value, a positive error pulse may be generated at the DATA_OUT terminal. After a time period equal to the propagation delay of the transmission line, such a positive error pulse will arrive at the end of the transmission line opposite I/O buffer 10. The amplitude of the positive error pulse may be doubled at the end of the transmission line opposite I/O buffer 10. If the doubled amplitude of the positive error pulse exceeds the logic switchpoint level (e.g., Vdd/2), the positive error pulse may result in a false received logic "1" signal (i.e., a data transmission error). In order to reduce data transmission errors, enable signals EP1–EP5 and EN1–EN5 are always changed such that intermediate values of $Z_{OUT}$ are always less than original values. (See, for example, U.S. Pat. No. 5,751,161, "Update Scheme for Impedance Controlled I/O Buffers", incorporated herein by reference in its entirety).

In a straightforward approach to testing I/O buffer 10, all $2^5$ (32) possible combinations of EP1–EP5 would be required to verify the output impedance $Z_{OUT}$ of I/O buffer 10 when output data signal DATA_OUT is a logic "1". Similarly, all $2^5$ (32) possible combinations of EN1–EN5 would be required to verify the output impedance $Z_{OUT}$ of I/O buffer 10 when output data signal DATA_OUT is a logic "0". Thus at least $2 \cdot 2^5$ (64) separate tests are required to verify the output impedance $Z_{OUT}$ of I/O buffer 10. An integrated circuit may include, for example, hundreds of impedance-controlled I/O buffers 10. It is desirable to keep total testing time per integrated circuit to a minimum in order to produce as many integrated circuits as possible in a given amount of time. It would thus be beneficial to have a method and apparatus for testing a controlled-impedance I/O buffer in a manner which reduces the required test time.

SUMMARY OF THE INVENTION

A method and apparatus for testing an input/output (I/O) buffer in a highly efficient manner are disclosed. The I/O buffer includes multiple transistors coupled to a data output terminal. The method includes enabling a single one of the multiple transistors. A predetermined electrical voltage level is then forced upon the data output terminal, and a resultant electrical current flowing through the data output terminal (e.g., in a direction away from the I/O buffer) is measured. The measured electrical current is compared to predetermined minimum and maximum current values. A ratio of the measured electrical current to a reference current is computed, and the computed current ratio is compared to a predetermined minimum and maximum current ratio. The above steps may be repeated until each of the multiple transistors has been enabled.

The drive strength of a given transistor is a measure of the amount of electrical current the transistor causes to flow through the data output terminal when enabled. One or more of the multiple transistors has a drive strength which is less than all of the other transistors (i.e., a minimum drive strength). The reference current may be the amount of electrical current flowing through the data output terminal with the predetermined voltage level forced thereupon when the single enabled transistor has the minimum drive strength.

The I/O buffer may include multiple inputs for enabling the multiple transistors and a data input terminal. The enabling step may include applying signals to the inputs and the data input terminal such that the single one of the multiple transistors is enabled. A grouping of such signals applied to the inputs of the I/O buffer is termed herein an "enable signal input pattern."

The multiple transistors may include several n-channel transistors coupled between a first power supply voltage and the data output terminal, and an equal number of p-channel transistors coupled between the data output terminal and a second power supply voltage. During testing, the data output terminal may forced to an electrical voltage level midway between the first and second voltage levels. For example, when the first voltage level (e.g., $V_{DD}$) is a referenced to the second voltage level (e.g., $V_{SS}$) the data output terminal may be forced to $V_{DD}/2$.

The predetermined minimum electrical current value may be determined from a maximum output impedance value for the I/O buffer when the single one of the multiple transistors is enabled. Similarly, the predetermined maximum electrical current value may be determined from a minimum output impedance value for the I/O buffer when the single one of the multiple transistors is enabled.

One or more of the several n-channel transistors may have a reference (e.g., minimum) drive strength, and the other n-channel transistors may have a drive strength greater than the reference drive strength. The predetermined minimum and maximum current ratios used when a given n-channel transistor is the single transistor enabled may be based upon a ratio of the drive strength of the enabled n-channel transistor to the reference drive strength.

The apparatus for testing the I/O buffer includes a test unit adapted for coupling to the I/O buffer. The test unit includes a memory unit for storing an enable signal input pattern, and the corresponding minimum and maximum electrical current values and current ratios. During use, the test unit may apply the enable signal input pattern to the multiple inputs of the I/O buffer, force an electrical voltage of $V_{DD}/2$ upon the data output terminal, measure a resultant electrical current flowing through the data output terminal, compare the measured electrical current to the minimum and maximum electrical current values, compute a ratio of the measured electrical current to the reference current, and compare the computed current ratio to the minimum and maximum current ratios.

The logic states of I/O buffer inputs may define impedance "states" of the I/O buffer. Impedance differences between such I/O buffer impedance states must be sufficient to reduce transmission errors. By testing the impedances of the individual transistors of an I/O buffer independently, the above described method and apparatus accomplish I/O buffer testing in a highly efficient manner.

BRIEF DESCRIPTION OF THE DRAWINGS

Other objects and advantages of the invention will become apparent upon reading the following detailed description and upon reference to the accompanying drawings in which.

Figure 1:
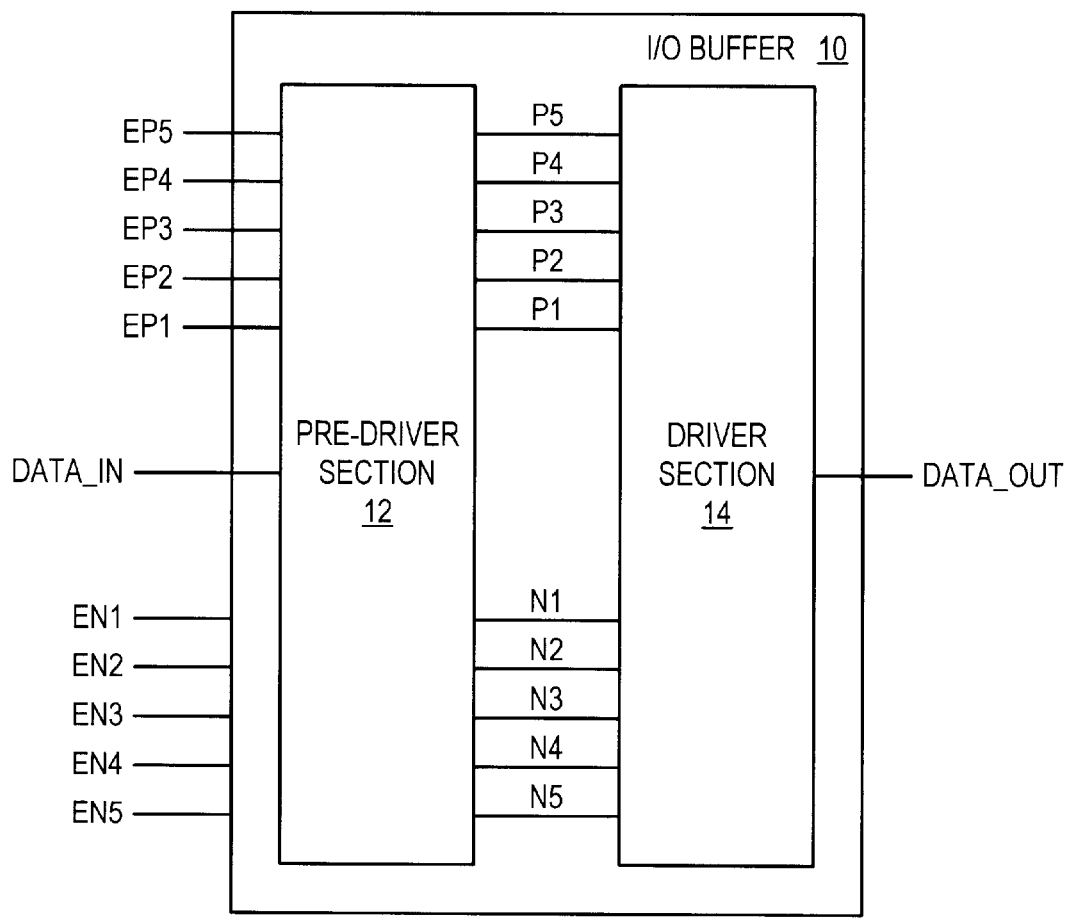
FIG. 1 is a block diagram of an exemplary impedance-controlled input/output (I/O) buffer, wherein the I/O buffer includes a pre-driver section coupled to a driver section.
Figure 2:
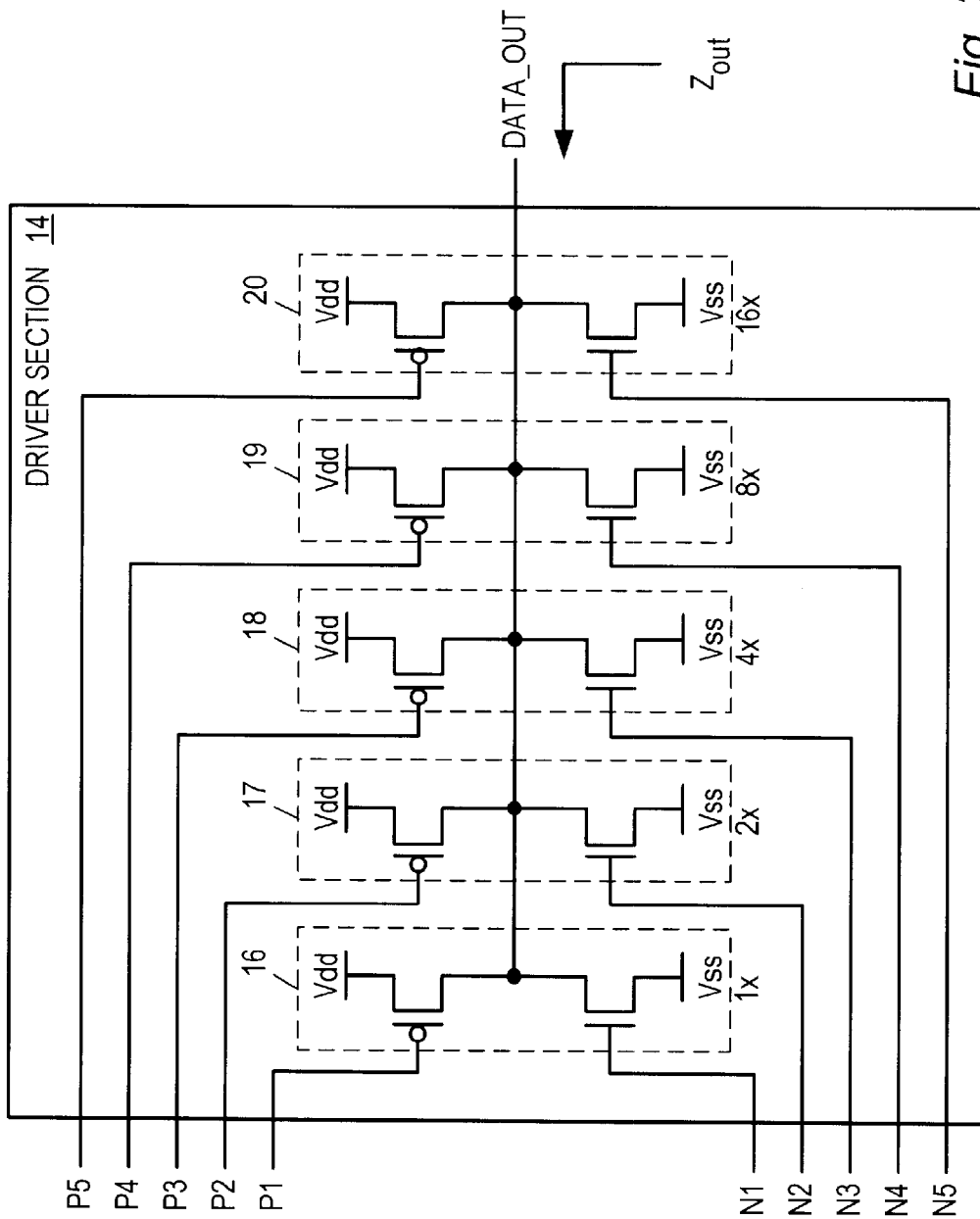
FIG. 2 is a circuit diagram of an exemplary embodiment of the driver section of FIG. 1, wherein the driver section includes multiple driver pairs, and wherein each driver pair includes a p-channel transistor coupled between a first power supply voltage $V_{DD}$ and a data output terminal and an n-channel transistor connected between the data output terminal a second power supply voltage $V_{SS}$, where $V_{DD} > V_{SS}$.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As described above, enable signals EP1–EP5 and EN1–EN5 may be asserted separately in order to enable one or more transistors of driver pairs 16–20 of driver section 14. The drive strengths of transistors enabled simultaneously (i.e., operated in parallel) are additive, and the output impedance $Z_{OUT}$ of I/O buffer 10 is a parallel combination of the impedances of all of the enabled transistors. The testing of I/O buffer 10 may be accomplished in a highly efficient manner by recognizing that it is only necessary to determine the output impedances of each individual transistor within driver section 14. Tests in which multiple transistors are enabled simultaneously may be eliminated as the results can be predicted based upon the determinations of the output impedances of the individual transistors.

The output impedances of the individual transistors may vary over wide ranges (e.g., ±20%) between lots due to manufacturing variations. On the other hand, the relative output impedances of individual transistors formed simultaneously upon and within the same semiconductor substrate vary to a much lesser degree (e.g., ±10%). As a result, it is advantageous to determine the ratios of the output impedances of the individual transistors in addition to the absolute values of the output impedances.

Figure 3A:
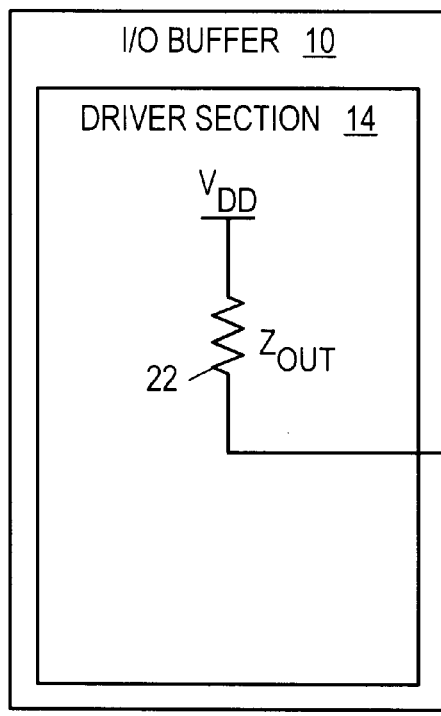
FIG. 3a is a diagram illustrating how the output impedance $Z_{OUT}$ of the I/O buffer may be determined when a logic "1" is present upon the data output terminal.
Figure 3A:
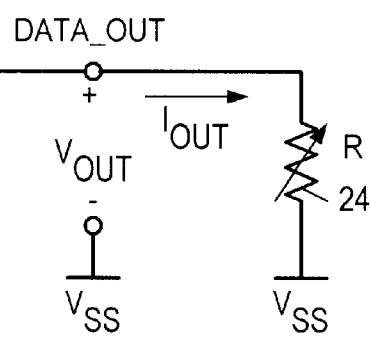

FIG. 3a is a diagram illustrating how the output impedance $Z_{OUT}$ of I/O buffer 10 may be determined when output data signal DATA_OUT is a logic "1" at the DATA_OUT terminal of I/O buffer 10. Output impedance $Z_{OUT}$ of I/O buffer 10 is represented by a resistor 22 connected between first power supply voltage $V_{DD}$ and the DATA_OUT terminal. A variable resistor 24 may be connected between the DATA_OUT terminal and second power supply voltage $V_{SS}$ as shown in FIG. 3a.

The resistance value of variable resistor 24 may be varied until voltage $V_{OUT}$ at the DATA_OUT terminal (i.e., between the DATA_OUT terminal and second power supply voltage $V_{SS}$) is midway between first power supply voltage $V_{DD}$ and second power supply voltage $V_{SS}$. Normally, first power supply voltage $V_{DD}$ is referenced to second power supply voltage $V_{SS}$, thus variable resistor 24 may be varied until voltage $V_{OUT}$ at the DATA_OUT terminal is equal to $V_{DD}/2$. Hereinbelow, first power supply voltage $V_{DD}$ is assumed to be referenced to second power supply voltage $V_{SS}$.

When $V_{OUT}$ is equal to $V_{DD}/2$, the resistance value of variable resistor 24 is equal to output impedance $Z_{OUT}$ of I/O buffer 10. The resistance value of variable resistor 24 is also equal to $V_{OUT}/I_{OUT}$, where $I_{OUT}$ is the current flowing out of the DATA_OUT terminal and through variable resistor 24. Since $V_{OUT}$ is known to be equal to $V_{DD}/2$, output impedance $Z_{OUT}$ of I/O buffer 10 may be determined from $I_{OUT}$. In other words, output impedance $Z_{OUT}$ of I/O buffer 10 may be determined by measuring current $I_{OUT}$ flowing out of the DATA_OUT terminal when the voltage at the DATA_OUT terminal is forced to $V_{DD}/2$.

Figure 3B:
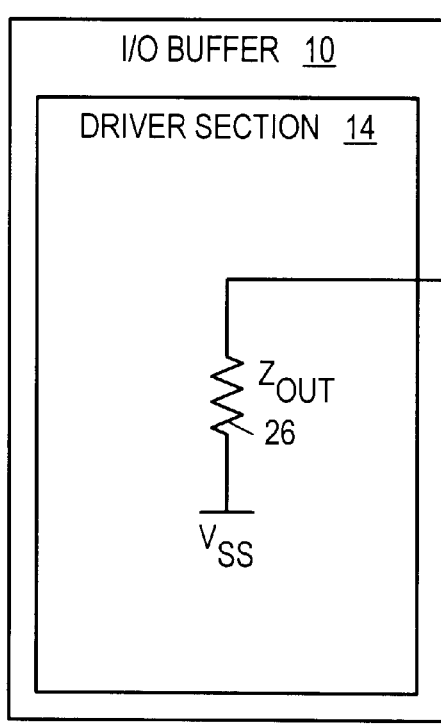
FIG. 3b is a diagram illustrating how the output impedance $Z_{OUT}$ of the I/O buffer may be determined when a logic "0" is present upon the data output terminal.
Figure 3B:
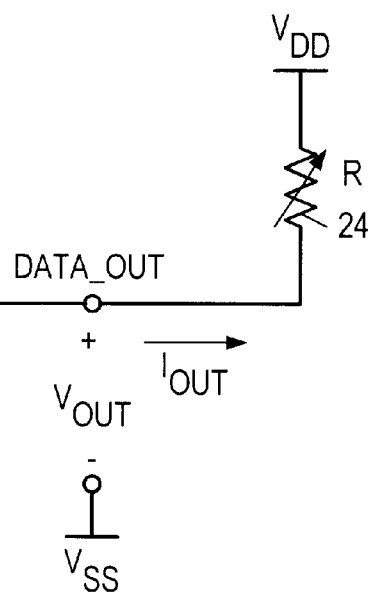

FIG. 3b is a diagram illustrating how output impedance $Z_{OUT}$ of I/O buffer 10 may be determined when output data signal DATA_OUT is a logic "0" at the DATA_OUT terminal of I/O buffer 10. In this case, output impedance $Z_{OUT}$ of I/O buffer 10 is represented by a resistor 26 connected between second power supply voltage $V_{SS}$ and the DATA_OUT terminal. Variable resistor 24 may be connected between the DATA_OUT terminal and first power supply voltage $V_{DD}$ as shown in FIG. 3b. The resistance value of variable resistor 24 may again be varied until voltage $V_{OUT}$ at the DATA_OUT terminal is equal to $V_{DD}/2$. As before, when $V_{OUT}$ is equal to $V_{Dd}/2$, the resistance value of variable resistor 24 is equal to output impedance $Z_{OUT}$ of I/O buffer 10. The resistance value of variable resistor 24 is also equal to $(V_{OUT}V_{DD})/I_{OUT}$. It is noted that in this case, $I_{OUT}$ is a negative value, as is $(V_{OUT}V_{DD})$. Since both $V_{DD}$ and $V_{OUT}$ are known values, output impedance $Z_{OUT}$ of I/O buffer 10 may be determined from Iout. In other words, output impedance $Z_{OUT}$ of I/O buffer 10 may again be determined by measuring current Iout flowing out of the DATA_OUT terminal when the voltage at the DATA_OUT terminal is forced to $V_{DD}/2$.

As output impedance $Z_{OUT}$ of I/O buffer 10 may be determined by measuring current $I_{OUT}$ flowing out of the DATA_OUT terminal when the voltage at the DATA_OUT terminal is forced to $V_{DD}/2$, it is not necessary to calculate $Z_{OUT}$ and compare the impedance to minimum and maximum values of an acceptable range of impedance values. The minimum and maximum values of the acceptable range of impedance values may be converted into minimum and maximum values of an acceptable range of output current $I_{OUT}$ when the voltage at the DATA_OUT terminal is forced to $V_{DD}/2$. When a value of $I_{OUT}$ measured during testing lies within the converted minimum and maximum output current values, the output impedance $Z_{OUT}$ of I/O buffer 10 is within the acceptable range of impedance values. Thus measured values of $I_{OUT}$ may be compared to the converted minimum and maximum current values in order to ensure the output impedance $Z_{OUT}$ of I/O buffer 10 is within the acceptable range of impedance values. Similarly, the ratios of output impedances of the transistors of driver section 14 may be determined by ratios of the corresponding measured values of $I_{OUT}$. Such conversions reduce testing time when testing hardware or software must determine if output impedances of I/O buffers lie within acceptable ranges of impedance values during testing.

An efficient method for testing controlled-impedance I/O buffer 10 will now be described. First, a testing table for the n-channel transistors in driver section 14 may be generated. Table 1 below is an exemplary testing table for the n-channel transistors within driver section 14 of I/O buffer 10:

TABLE 1

Exemplary Testing Table For N-Channel Transistors of I/O Buffer 10.

| Enable Input Pattern | Minimum Current Value | Maximum Current Value | Minimum Current Ratio | Maximum Current Ratio |
| --- | --- | --- | --- | --- |
| 00001 | −4.0 | −6.0 | 1.0 | 1.0 |
| 00010 | −8.0 | −12.0 | 1.9 | 2.1 |
| 00100 | −16.0 | −24.0 | 3.6 | 4.4 |
| 01000 | −32.0 | −48.0 | 7.2 | 8.8 |
| 10000 | −64.0 | −96.0 | 15.4 | 17.6 |

A first column of the testing table includes enable signal input patterns. Each enable signal input pattern has 5 bit positions, one for each enable signal EN1–EN5. From left to right, each bit position of an enable signal input pattern corresponds to EN5, EN4, EN3, EN2, and EN1. A logic "0" in a bit position disables (i.e., "turns off") the corresponding n-channel transistor in driver section 14, and a logic "1" in a bit position enable (i.e., "turns on") the corresponding n-channel transistor. Each enable signal input pattern in the testing table has a logic "1" in only one bit position, thus each enable signal input pattern enables one and only one of the n-channel transistors in driver section 14. The number of enable signal input patterns in the testing table is equal to the number of n-channel transistors in driver section 14. The enable signal input patterns are arranged within the testing table in increasing order of drive strength of the n-channel transistor enabled by the pattern.

Second and third columns of the testing table include minimum and maximum values of output current $I_{OUT}$. During testing, a single n-channel transistor is enabled, the voltage at the DATA_OUT terminal is forced to $V_{DD}/2$, and the output current $I_{OUT}$ flowing out of the DATA_OUT terminal is measured. It is noted that the values of output current $I_{OUT}$ in the second and third columns of the testing table are negative as current flows into the DATA_OUT terminal under the above conditions. Minimum and maximum output impedance values for each of the n-channel transistors in driver section 14 are converted to corresponding maximum and minimum values of output current $I_{OUT}$ as described above. The second and third columns of the testing table thus reflect minimum and maximum values of acceptable ranges of output current $I_{OUT}$ for enabled n-channel transistors in driver section 14.

Fourth and fifth columns of the testing table include minimum and maximum current ratios. The measured output current $I_{OUT}$ of each n-channel transistor is divided by the output current of the n-channel transistor of the driver pair with the smallest drive strength (i.e., driver pair 16) in order to determine a current ratio. The minimum and maximum current ratios in the fourth and fifth columns of the testing table reflect minimum and maximum values of acceptable ranges of current ratios for the enabled n-channel transistors in driver section 14.

Figure 4A:
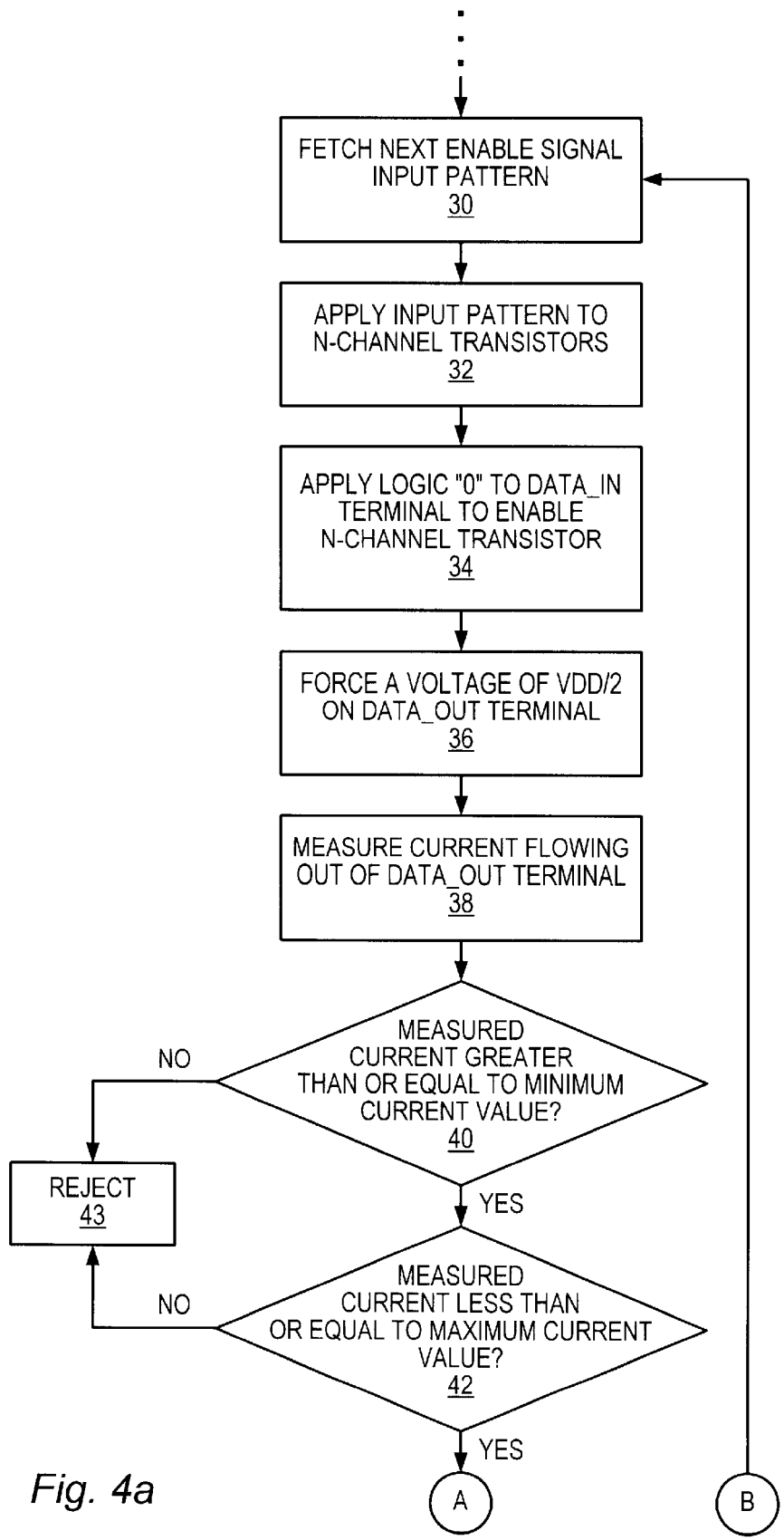
FIGS. 4a–b illustrate a flow chart of one embodiment of a method for testing the controlled-impedance I/O buffer of FIG. 1.
Figure 4B:
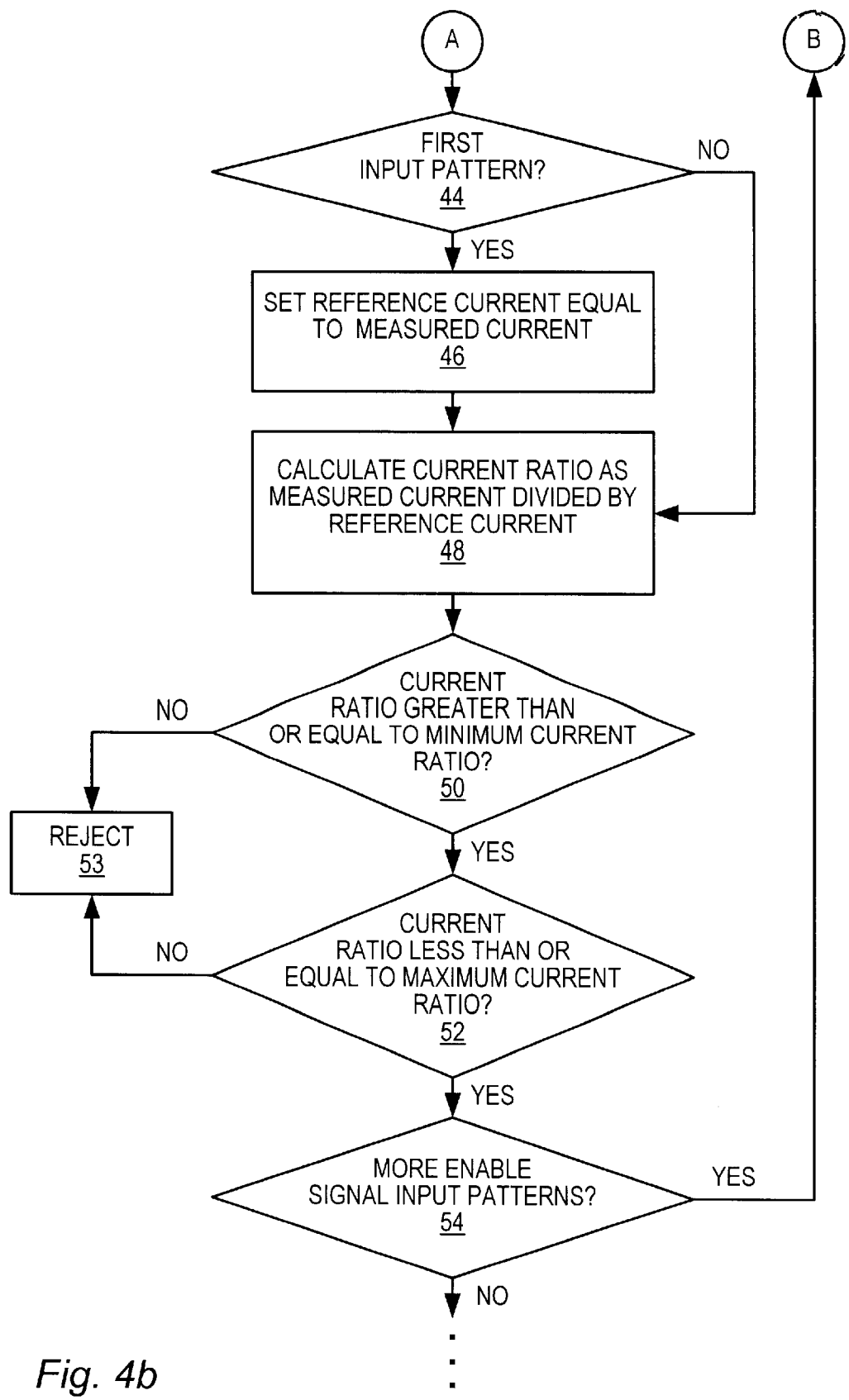

FIGS. 4a–b illustrate a flow chart of one embodiment of a method for testing a controlled-impedance I/O buffer such as I/O buffer 10. In a step 30, an enable signal input pattern is fetched. Each enable signal input pattern enables only one n-channel transistor in driver section 14, and the enable signal input patterns are selected in increasing order of drive strength of the n-channel transistors. The next enable signal input pattern may be selected from the testing table described above. When step 30 is executed for the first time, the enable signal input pattern '00001' is fetched.

In a step 32, the enable signal input pattern is applied to the n-channel transistors. When I/O buffer 10 is the I/O buffer under test, the bits of the enable signal input pattern are applied to corresponding enable signals EN1–EN5 of pre-driver section 12. It is noted that signals may also applied to enable signals EP1–EP5 of pre-driver section 12 to ensure all of the p-channel transistors of driver section 14 are disabled. When a logic "0" is applied to the DATA_IN terminal of I/O buffer 10 during a step 34, one of the n-channel transistors in driver section 14 is enabled. As described above, pre-driver section 12 may include logic elements which produce n-channel transistor control signals N1–N5 from enable signals EN1–EN5 and input data signal DATA_IN. When a logic "0" is applied to the DATA_IN terminal of I/O buffer 10, pre-driver section 12 may produce n-channel transistor control signals N1–N5 such that the logic values of control signals N1–N5 are the same as the logic values of respective enable signals EN1–EN5. Thus a selected n-channel transistor in driver section 14 is enabled when a logic "0" is applied to the DATA_IN terminal of I/O buffer 10, the selected transistor being determined by the enable signal input pattern (i.e., enable signals EN1–EN5).

In a step 36, a voltage of $V_{DD}/2$ is forced upon the DATA_OUT terminal. This may be accomplished by connecting a variable resistor between the DATA_OUT terminal and power supply voltage $V_{SS}$, and varying the resistance of the variable resistor until voltage $V_{OUT}$ at the DATA_OUT terminal is equal to $V_{DD}/2$ as described above. Output current $I_{OUT}$ flowing out of the DATA_OUT terminal with voltage $V_{OUT}$ equal to $V_{DD}/2$ is measured in a subsequent step 38.

In steps 40 and 42, measured output current $I_{OUT}$ is compared to pre-established minimum and maximum current values. The minimum and maximum current values may be determined by converting corresponding minimum and maximum output impedance values to current values as described above, and may be found in respective columns two and three of the testing table corresponding to the row including the enable signal input pattern. If the measured output current $I_{OUT}$ is not greater than or equal to the minimum current value in step 40, or less than or equal to the maximum current value in step 42, the failure of the I/O buffer to meet the output current (i.e., output impedance) specification may lead to rejection of the I/O buffer in a step 43. It is noted that the testing may be continued in order to obtain additional information.

A ratio of the measured n-channel transistor output current $I_{OUT}$ to the measured output current for the n-channel transistor having the smallest drive strength (e.g., the n-channel transistor of driver pair 16 in driver section 14) is computed in steps 44, 46, and 48. As described above, the enable signal input patterns in the testing table are arranged in increasing order of drive strength of the n-channel transistor enabled by the pattern. Thus the first enable signal input pattern enables the n-channel transistor having the smallest drive strength. A reference current is set equal to the output current of the n-channel transistor having the smallest drive strength in steps 44 and 46. In a step 48, the current ratio for the n-channel transistor enabled by the enable signal input pattern is computed by dividing the measured output current $I_{OUT}$ by the reference current.

In steps 50 and 52, the current ratio calculated in step 48 is compared to pre-established minimum and maximum current ratios. The minimum and maximum current ratios may be the minimum and maximum values of an acceptable range of current ratios for the enabled n-channel transistor as described above, and may be found in respective columns four and five of the testing table corresponding to the row including the enable signal input pattern. If the measured current ratio is not greater than or equal to the minimum current ratio in step 50, or less than or equal to the maximum current ratio in step 52, the failure of the I/O buffer to meet the current ratio specification may lead to the I/O buffer being rejected in a step 53. It is noted that the testing may be continued in order to obtain additional information. A step 54 causes the above testing steps to be repeated until there are no more enable signal input patterns.

The above steps may be repeated in order to test the portion of I/O buffer 10 pertaining to the p-channel transistors of driver section 14. In step 30, each enable signal input pattern enables only one p-channel transistor in driver section 14, and the enable signal input patterns are arranged in increasing order of drive strength of the p-channel transistors. When step 30 is executed for the first time, an enable signal input pattern '00001' may be fetched, where pre-driver section 12 produces p-channel transistor control signals P1–P5 such that the logic values of control signals P1–P5 are the logical complements of respective enable signals EP1–EP5. In steps 32 and 34, pre-driver section 12 may respond to a logic "1" applied to the DATA_IN terminal of I/O buffer 10 by generating control signals P1–P5. It is noted that signals may also applied to enable signals EN1–EN5 of pre-driver section 12 to ensure all of the n-channel transistors of driver section 14 are disabled. In step 36, the variable resistor may be connected between the DATA_OUT terminal and power supply voltage $V_{DD}$, and the resistance of the variable resistor may be varied until voltage $V_{OUT}$ at the DATA_OUT terminal is equal to $V_{DD}/2$ as described above.

Figure 5:
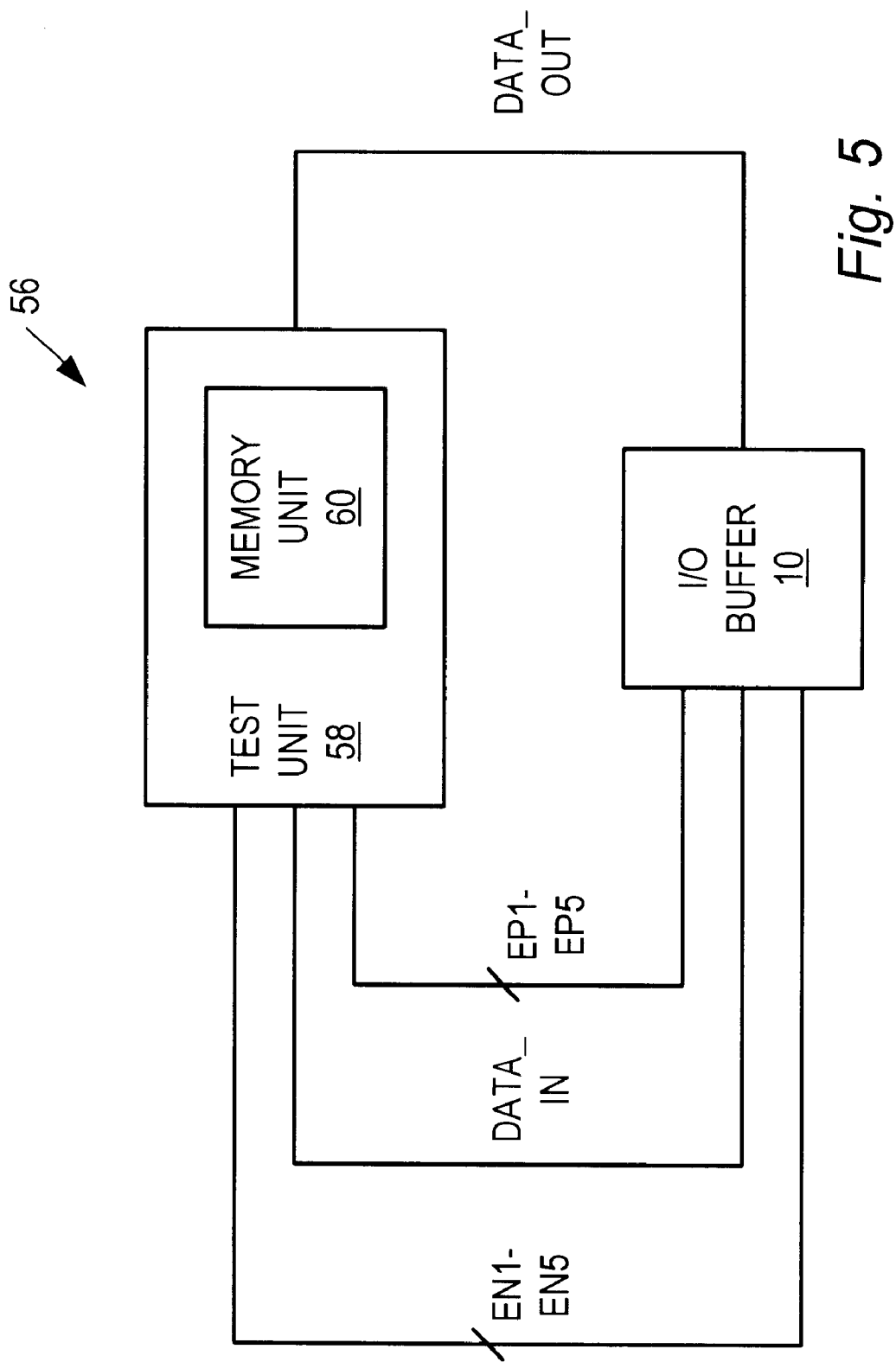
FIG. 5 is a block diagram of one embodiment of an apparatus for testing the controlled-impedance I/O buffer of FIG. 1.

FIG. 5 is a block diagram of one embodiment of an apparatus 56 for testing controlled-impedance I/O buffer 10. Apparatus 56 includes a test unit 58 coupled to I/O buffer 10. Test unit 58 provides signals EN1–EN5, DATA_IN, and EP1–EP5 to I/O buffer 10 during testing, and also has an electrical connection to the DATA_OUT terminal of I/O buffer 10.

Test unit 58 may embody circuitry for accomplishing the above described method of testing I/O buffer 10. In the embodiment of FIG. 5, test unit 58 includes a memory unit 60 for storing the enable signal input patterns, and the minimum and maximum current values and ratios corresponding to each enable signal input pattern. Memory unit 60 may store testing tables for the n-channel and p-channel transistors as described above. During testing of the n-channel transistors, test unit 58 may select and apply enable signal input patterns to EN1–EN5, and may apply a logic "0" to the DATA_IN terminal of I/O buffer 10. During testing of the p-channel transistors, test unit 58 may select and apply enable signal input patterns to EP1–EP5, and may apply a logic "1" to the DATA_IN terminal. Test unit 58 may include means for forcing a voltage of $V_{DD}/2$ upon the DATA_OUT terminal, and for measuring the resultant output current $I_{OUT}$ flowing through (e.g., out of) the DATA_OUT terminal. Test unit 58 may include circuitry for comparing measured output currents $I_{OUT}$ the minimum and maximum current values, calculating current ratios, and comparing the current ratios to the minimum and maximum current ratios.

What is claimed is:

1. A method for testing an input/output (I/O) buffer including a plurality of transistors coupled to a data output terminal, the method comprising:
   enabling a single one of the plurality of transistors;
   forcing a predetermined electrical voltage level upon the data output terminal;
   measuring an electrical current flowing through the data output terminal with the predetermined voltage level forced thereupon;
   comparing the measured electrical current to a predetermined minimum current value and a predetermined maximum electrical current value;
   computing a ratio of the measured electrical current to a reference current; and
   comparing the computed current ratio to a predetermined minimum current ratio and a predetermined maximum current ratio.

2. The method as recited in claim 1, wherein the drive strength of a given transistor is a measure of the amount of electrical current the transistor causes to flow through the data output terminal when enabled.

3. The method as recited in claim 1, wherein at least one of the plurality of the transistors has a minimum drive strength, and wherein the reference current is the electrical current flowing through the data output terminal with the predetermined voltage level forced thereupon when the single enabled transistor has the minimum drive strength.

4. The method as recited in claim 1, wherein the I/O buffer further comprises a plurality of inputs for enabling the plurality of transistors and a data input terminal, and wherein the enabling comprises applying signals to the inputs and the data input terminal such that a single one of the plurality of transistors is enabled.

5. The method as recited in claim 4, wherein the signals applied to the inputs of the I/O buffer comprise an enable signal input pattern.

6. The method as recited in claim 1, wherein the plurality of transistors comprises a plurality of p-channel transistors coupled between a first power supply voltage and the data output terminal and a plurality of n-channel transistors coupled between the data output terminal and a second power supply voltage, and wherein the predetermined electrical voltage level used during the forcing is midway between the first and second voltage levels.

7. The method as recited in claim 6, wherein at least one of the plurality of n-channel transistors has a reference drive strength, and wherein a remainder of the plurality of n-channel transistors have a drive strength greater than the reference drive strength, and wherein the predetermined minimum and maximum current ratios used when a given n-channel transistor is the single transistor enabled are based upon a ratio of the drive strength of the enabled n-channel transistor to the reference drive strength.

8. The method as recited in claim 1, wherein the first voltage level is a referenced to the second voltage level such that the predetermined electrical voltage level used during the forcing is half the first voltage level.

9. The method as recited in claim 1, wherein the measuring comprises measuring an electrical current flowing through the data output terminal in a direction away from the I/O buffer when the data output terminal is forced to the predetermined voltage level.

10. The method as recited in claim 1, wherein the predetermined minimum electrical current value is determined from a maximum output impedance value for the I/O buffer when the single one of the plurality of transistors is enabled.

11. The method as recited in claim 1, wherein the predetermined maximum electrical current value is determined from a minimum output impedance value for the I/O buffer when the single one of the plurality of transistors is enabled.

12. A method for testing an input/output (I/O) buffer including a plurality of transistors, wherein a first portion of the plurality of transistors are coupled between a power supply voltage $V_{DD}$ and a data output terminal, and wherein a second portion of the plurality of transistors are coupled between the data output terminal and a reference power supply voltage, and wherein the I/O buffer has a plurality of inputs for enabling the plurality of transistors, the method comprising:

applying an enable signal input pattern to the inputs of the I/O buffer, wherein the enable signal input pattern enables a single one of the plurality of transistors;

forcing an electrical voltage of $V_{DD}/2$ upon the data output terminal;

measuring an electrical current flowing through the data output terminal with the electrical voltage $V_{DD}/2$ forced thereupon;

comparing the measured electrical current to a predetermined minimum electrical value and a maximum electrical current value;

computing a ratio of the measured electrical current to a reference current;

comparing the computed current ratio to a predetermined minimum current ratio and maximum current ratio; and repeating the above steps until each of the plurality of transistors has been enabled.

13. The method as recited in claim 12, wherein at least one of the plurality of the transistors has a minimum drive strength, and wherein the reference current is the electrical current flowing through the data output terminal with the electrical voltage $V_{DD}/2$ forced thereupon when the single enabled transistor has the minimum drive strength.

14. The method as recited in claim 12, wherein the measuring comprises measuring an electrical current flowing out of the data output terminal when forced to the predetermined voltage level.

15. The method as recited in claim 12, wherein the predetermined minimum electrical current value is determined from a maximum impedance value for the I/O buffer when the single one of the plurality of transistors is enabled.

16. The method as recited in claim 12, wherein the predetermined maximum electrical current value is determined from a minimum output impedance value for the I/O buffer when the single one of the plurality of transistors is enabled.

17. The method as recited in claim 12, wherein the first portion of the plurality of transistors comprises a plurality of n-channel transistors and the second portion of the plurality of transistors comprises a plurality of p-channel transistors.

18. The method as recited in claim 17, wherein at least one of the plurality of n-channel transistors has a reference drive strength, and wherein a remainder of the plurality of n-channel transistors have a drive strength greater than the reference drive strength, and wherein the predetermined minimum and maximum current ratios used when a given n-channel transistor is the single enabled transistor are based upon a ratio of the drive strength of the enabled n-channel transistor to the reference drive strength.

19. An apparatus for testing an input/output (I/O) buffer, wherein the I/O buffer includes a plurality of transistors, and wherein a first portion of the plurality of transistors are coupled between a power supply voltage $V_{DD}$ and a data output terminal, and wherein a second portion of the plurality of transistors are coupled between the data output terminal and a reference power supply voltage, and wherein the I/O buffer has a plurality of inputs for enabling the plurality of transistors, the apparatus comprising:

a test unit adapted for coupling to the I/O buffer, wherein the test unit comprises a memory unit for storing an enable signal input pattern, a minimum electrical current value, a maximum electrical current value, a minimum current ratio, and a maximum current ratio, and wherein the enable signal input pattern enables a single one of the plurality of transistors; and wherein during use the test unit applies the enable signal input pattern to the plurality of inputs of the I/O buffer, forces an electrical voltage of $V_{DD}/2$ upon the data output terminal, measures an electrical current flowing through the data output terminal with electrical voltage $V_{DD}/2$ forced thereupon, compares the measured electrical current to the minimum and maximum electrical current values, computes a ratio of the measured electrical current to a reference current, and compares the computed current ratio to the minimum and maximum current ratios.

20. The apparatus as recited in claim 19, wherein at least one of the plurality of the transistors has a minimum drive strength, and wherein the reference current is the electrical current flowing through the data output terminal with the electrical voltage of $V_{DD}/2$ forced thereupon when the single enabled transistor has the minimum drive strength.

* * * * *